(12) United States Patent
Sharma et al.

(10) Patent No.: US 11,533,068 B1
(45) Date of Patent: Dec. 20, 2022

(54) LOW INTERMEDIATE FREQUENCY TRANSMITTER

(71) Applicant: Texas Instruments Incorporated, Dallas, TX (US)

(72) Inventors: Rahul Sharma, Bengaluru (IN); Karthikeyan Gunasekaran, Chennai (IN); Sarma Sundareswara Gunturi, Bengaluru (IN); Ram Narayan Krishna Nama Mony, Bengaluru (IN); Jaiganesh Balakrishnan, Bengaluru (IN); Sandeep Kesrimal Oswal, Bengaluru (IN); Visvesvaraya Pentakota, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/462,145

(22) Filed: Aug. 31, 2021

(51) Int. Cl.
 *H04L 5/12* (2006.01)
 *H04L 23/02* (2006.01)
 *H04B 1/00* (2006.01)
 *H04B 1/30* (2006.01)

(52) U.S. Cl.
 CPC ............ *H04B 1/0028* (2013.01); *H04B 1/30* (2013.01); *H04B 2001/305* (2013.01)

(58) Field of Classification Search
 CPC ... H04B 1/0028; H04B 1/30; H04B 2001/305

USPC .......................................................... 375/262
See application file for complete search history.

(56) References Cited

U.S. PATENT DOCUMENTS

| | | | |
|---|---|---|---|
| 9,160,588 B2* | 10/2015 | Shibata | ................. H04L 27/142 |
| 2006/0045205 A1* | 3/2006 | Jensen | .................. H04L 27/361 |
| | | | 375/297 |
| 2006/0209881 A1* | 9/2006 | Howard | ............ H04L 25/03343 |
| | | | 370/465 |
| 2006/0209986 A1* | 9/2006 | Jensen | ................ H04L 27/0008 |
| | | | 375/302 |

\* cited by examiner

*Primary Examiner* — Tanmay K Shah
(74) *Attorney, Agent, or Firm* — John R. Pessetto; Frank D. Cimino (57) ABSTRACT

A radio frequency transmitter includes an upconverter that outputs in-phase (I) and quadrature (Q) signals, a digital timing offset circuit, first and second digital-to-analog converters (DACs), an analog timing offset removal circuit, first and second pulse shapers, and an adder. The digital timing offset circuit introduces a time offset between the I and Q signals. The first and second DACs output analog I and Q signals, respectively, and have first and second clock signals, respectively. The first and second clock signals have the same frequency and are offset relative to each other by the time offset. The analog timing offset removal circuit removes the time offset between the analog I and Q signals. The first and second pulse shapers receive the analog I and Q signals, respectively, and output pulse-shaped I and Q signals. The adder receives the pulse-shaped I and Q signals and outputs an intermediate frequency signal.

24 Claims, 7 Drawing Sheets

LOW INTERMEDIATE FREQUENCY TRANSMITTER

BACKGROUND

Multiple input multiple output (MIMO) transceivers often support wide transmitter bandwidths for 32 or 64 antenna systems. The transmitter bandwidth can be, for example, two to three times wider than the receiver bandwidth to account for digital predistortion which compensates for non-linearities in power amplifiers in the transmitter signal chain. In radio frequency (RF) sampling transmitters, transmitting a signal in a particular frequency band creates an image, that is, an undesired signal, in a nearby frequency band. For example, an RF sampling digital-to-analog converter (DAC) with a sampling rate of six giga-samples per second transmitting in a 2.6 gigaHertz (GHz) band generates an image in the 3.4 GHz band. A sharp bandpass filter is required to attenuate the signal in the image band while retaining the signal of interest, which increases the area, power consumption, and cost of the transmitter. Traditional zero intermediate frequency architectures, sometimes called direct conversion or homodyne architectures, use a local oscillator set at the desired carrier frequency to directly down convert the received signal to the baseband. These traditional zero intermediate frequency architectures do not require a sharp bandpass filter but require multiple clock signals as well as image reject filters. Such filters also increase the area and power consumption of the system.

SUMMARY

A radio frequency (RF) transmitter includes an upconverter, a digital timing offset circuit, a first digital-to-analog converter (DAC), a second DAC, an analog timing offset removal circuit, a first pulse-shaper, a second pulse-shaper, and an adder. The upconverter outputs an in-phase (I) signal and a quadrature (Q) signal. The digital timing offset circuit introduces a time offset between the I signal and the Q signal. The first DAC has a first clock signal and outputs an analog I signal based on the I signal. The second DAC has a second clock signal and outputs an analog Q signal based on the Q signal. The first and second clock signals have a same frequency and are offset relative to each other by the time offset. The analog timing offset removal circuit removes the time offset between the analog I signal and the analog Q signal. The first pulse shaper receives the analog I signal and outputs a pulse-shaped I signal. The second pulse shaper receives the analog Q signal and outputs a pulse-shaped Q signal. The adder receives the pulse-shaped I and Q signals and outputs an intermediate frequency signal.

In some examples, the digital timing offset circuit is a delay circuit that introduces a delay of the time offset into the I signal. The analog timing offset removal circuit is an advance circuit that advances the analog I signal by the time offset. In other examples, the digital timing offset circuit is an advance circuit that introduces an advance of the time offset into the Q signal. The analog timing offset removal circuit is a delay circuit that delays the analog Q signal by the time offset. The RF transmitter can further include a delay circuit that delays the I signal by a first length of time equal to a number N times a period T of the I signal. The advance circuit introduces the advance of the time offset into the Q signal by delaying the Q signal by a second length of time equal to (N−1)T plus T minus the time offset. The RF transmitter includes a digital step attenuator and a power amplifier in some implementations. The time offset can be equal to one fourth a period T, one eighth a period T, or a period T divided by four times a number N.

BRIEF DESCRIPTION OF THE DRAWINGS

For a detailed description of various examples, reference will now be made to the accompanying drawings in which.

The same reference numerals and other reference designators are used in the drawings to designate the same or similar (by function and/or structure) features.

DETAILED DESCRIPTION

The disclosed radio frequency (RF) sampling transmitters (TXs) include a digital time advance circuit, two digital-to-analog converters (DACs) operating at the same clock frequency with an offset of one-fourth a period T (e.g. 90 degrees out of phase), and an analog delay circuit. An in-phase (I) signal is directly input to the first DAC, and the time advance circuit introduces a time advance into a quadrature (Q) signal before it is input to the second DAC. The analog delay circuit delays the analog Q signal output from the second DAC such that the time advance introduced by the time advance circuit is cancelled out. The I and Q signals may be data signals.

The analog in-phase I signal and the delayed analog Q signal are input into a first pulse shaper and a second pulse shaper, respectively, before being added together to generate an intermediate frequency signal. The offset of T/4 between the DAC clocks as well as the time advance and delay introduced into the Q signal can reduce the magnitude of image artifacts in frequencies adjacent to the signal of interest without a local oscillator or image reject filters, thereby reducing the area and power used by the RF sampling TX.

Figure 1A:
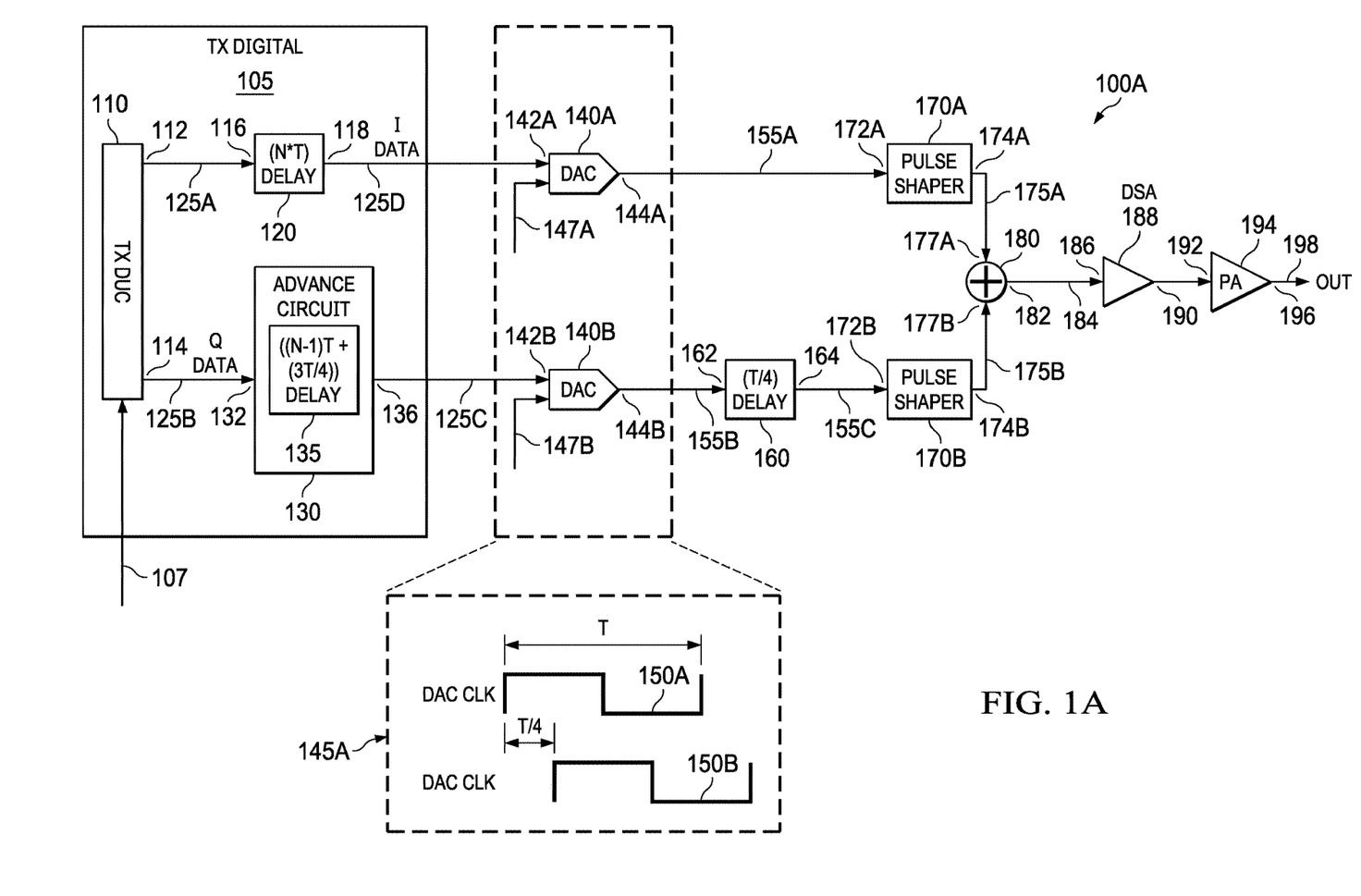
FIGS. 1A-1B show block diagrams of a radio frequency sampling transmitter according to two examples.

FIG. 1A shows a block diagram of an RF sampling transmitter 100A, which includes a digital TX 105, two return-to-zero (RZ) DACs 140A and 140B, a delay circuit 160, two pulse shapers 170A and 1706, an adder 180, a digital step attenuator (DSA) 188, and a power amplifier (PA) 195. The digital TX 105 includes a TX digital upconverter (DUC) 110, a delay circuit 120, and an advance circuit 130. TX DUC 110 has an input 107, a first output 112 and a second output 114. TX DUC 110 receives a signal to be transmitted at input 107 and converts the signal 107 into its I and Q components. The first output 112 is for the I data signal 125A, and the second output 114 is for the Q data signal 125B. The delay circuit 120 and the advance circuit 130 are digital timing offset circuits that adjust the I data signal 125A and the Q data signal 125B, respectively, such that the time-advanced Q data signal 125C has a time advancement relative to the delayed I signal 125D. The delay circuit 160 is an analog timing offset removal circuit.

The delay circuit 120 has an input 116 coupled to the output 112 of the TX DUC 110. The delay circuit 120 has an output 118 for the delayed I data signal 125D. The advance circuit 130 has an input 132 coupled to the output 114 of the TX DUC 110. The advance circuit 130 has an output 136 for the time-advanced Q data signal 125C. In this example implementation, the delay circuit 120 introduces a larger delay of a number N times the period T (N*T), and the advance circuit 130 introduces a smaller delay 135 of $$\left((N-1)T + \left(\frac{3T}{4}\right)\right).$$

That is, the delay circuit 120 introduces a larger delay into the I data signal than the smaller delay that advance circuit 130 introduces into the Q data signal, such that the time-advanced Q data signal 125C is one-fourth of T advanced relative to the N*T delayed I data signal 125D.

Figure 1B:
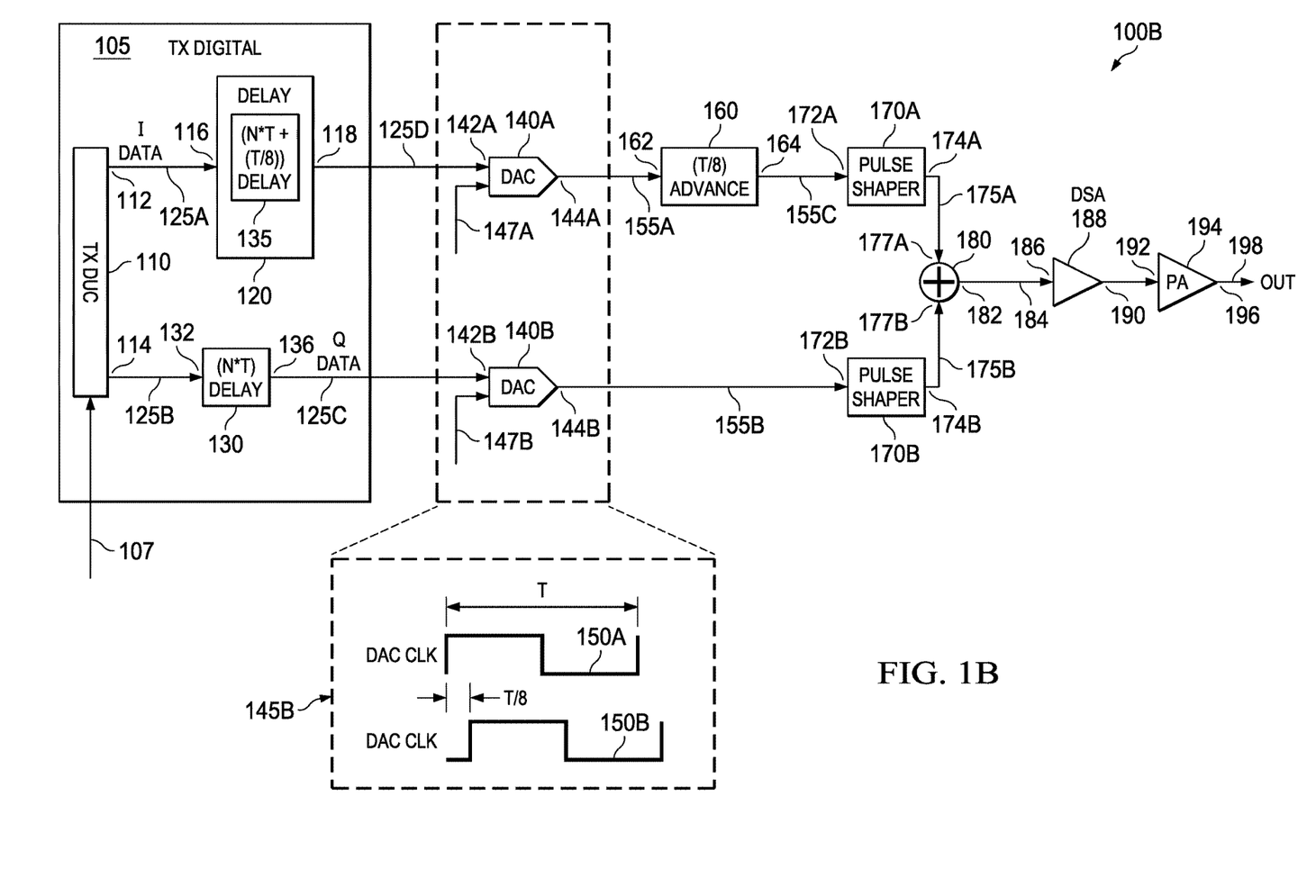

Any appropriate technique for advancing the Q data signal 125B relative to the I data signal 125A can be used. For example, the delay circuit 120 can introduce a delay of the period T times the sum of a number N plus one-fourth, and the advance circuit 130 can introduce a smaller delay of N times T. The length of the time advancement can be set (e.g. to one-fourth of T) to reduce the magnitude of image artifacts at odd harmonics of a sampling frequency fs of RZ DACs 140A and 140B. Alternatively, the length of the time advancement can be set to one-eighth of T as shown in FIG. 1B to reduce the magnitude of image artifacts at even harmonics of the sampling frequency fs. The delayed I data signal 125D is provided to the input 142A of the RZ DAC 140A, and the time-advanced Q data signal 125C is provided to the input 142B of the RZ DAC 140B.

RZ DACs 140A and 140B operate at a sampling frequency fs equal to the digital data rate. As illustrated in offset 145A, the RZ DACs 140A and 140B operate based on clock signals DAC CLKs 150A and 150B, respectively. RZ DAC 140A receives the clock signal DAC CLK 150A at an input 147A, and RZ DAC 140B receives the clock signal DAC CLK 150B at an input 147B. The clock signals DAC CLKs 150A and 150B are offset by one-fourth the period T of the clock signal relative to each other. The T/4 offset between DAC CLKs 150A and 150B matches the T/4 offset between the delayed I data signal 125D and the time-advanced Q data signal 125C and removes the need for a fractional phase locked loop acting as a shared local oscillator for the I and Q data signals, thereby reducing the area and power used by RF sampling transmitter 100A. In addition, removing the need for a local oscillator also removes the need for image-reject filters to reduce the magnitude of images introduced by the local oscillator.

RZ DAC 140A outputs the analog I signal 155A through output 144A, which is coupled to an input 172A of the pulse shaper 170A. RZ DAC 140B outputs the analog Q signal 155B through output 144B, which is coupled to the input 162 of the T/4 delay circuit 160. The delay circuit 160 cancels out the time advance (e.g. the T/4 or T/8 time advance as discussed above) introduced by advance circuit 130 and outputs the delayed Q signal 155C through output 164, which is coupled to the input 172B of the pulse shaper 170B. Any appropriate pulse shape may be used to boost the desired frequency content for a particular implementation. The pulse shaper 170A outputs the pulse-shaped I signal 175A through output 174A, which is coupled to an input 177A of the adder 180. The pulse shaper 170B outputs the pulse-shaped Q signal 175B through output 174B, which is coupled to an input 177B of the adder 180.

The pulse-shaped I signal 175A and the pulse-shaped Q signal 175B are combined together by adder 180 to generate an intermediate frequency (IF) signal 184, which is output through an output 182 of the adder 180. Adder 180 adds the I signal 175A and Q signal 175B to reduce above-band image artifacts, or subtracts the Q signal 175B from the I signal 175A to reduce below-band image artifacts. Adder 180 can be programmed by the user to perform the add operation or the subtract operation based on the desired performance of the RF sampling transmitter 100A. An input 186 of the DSA 188 is coupled to the output 182 of the adder 180. The DSA 188 performs an amplitude control operation on the signal received at input 186 and provides the amplitude-controlled signal to the output 190 of DSA 188, which is coupled to an input 192 of the PA 194. PA 194 generates a transmitter OUT signal 198 for output through the output 196 of the PA 194.

FIG. 1B shows a block diagram of an RF sampling transmitter 100B that is similar to the RF sampling transmitter 100A shown in FIG. 1A, but includes a delay and an advance in the I signal chain, instead of an advance and a delay in the Q signal chain, and illustrates a T/8 offset to reduce the magnitude of image artifacts at even harmonics of fs. TX DUC 110 outputs an I data signal 125A through output 112 and a Q data signal 125B through output 114. The delay circuits 120 and 130 are digital timing offset circuits and the advance circuit 160 is an analog timing offset removal circuit. In this implementation, the delay circuit 120 introduces a delay 135 of $$\left(NT + \left(\frac{T}{8}\right)\right)$$

into I data signal 125A, such that the delayed I signal 125D is T/8 delayed relative to the NT delayed Q data signal 125C.

Any appropriate technique for advancing the Q signal 125C relative to the delayed I data signal 125D can be used. For example, the delay circuit 120 can introduce a delay 135 of a number N times the period T, and the advance circuit 130 can introduce a smaller delay of $$\left((N-1)T + \left(\frac{7T}{8}\right)\right).$$

The length of the time advancement can be set to one-eighth of T to reduce the magnitude of image artifacts at even harmonics of fs. Alternatively, the length of the time advancement can be set to one-fourth of T to reduce the magnitude of image artifacts at odd harmonics of a sampling frequency fs of RZ DACs 140A and 140B as discussed previously herein with respect to FIG. 1A. The delayed I data signal 125D is provided to the input 142A of the RZ DAC 140A, and the Q signal 125C is provided to the input 142B of the RZ DAC 140B.

The RZ DACs 140A and 140B operate at an fs equal to the digital data rate. As illustrated in offset 145B, the RZ DACs 140A and 140B operate based on clock signals DAC CLKs 150A and 1506, respectively, which are offset by one eighth the period T of the clock signal relative to each other to match the T/8 offset between the delayed I data signal 125D and the Q data signal 125C. Clock signals 150A and 1506 are provided to RZ DAC 140A and RZ DAC 140B by inputs 147A and 147B, respectively. RZ DAC 140A outputs an analog I signal 155A through an output 144A, which is coupled to the input 162 of the T/8 advance circuit 160. The advance circuit 160 cancels out the T/8 delay introduced by delay circuit 120. The advanced I signal 155C is output from the output 164 of the advance circuit 160, which is coupled to the input 172A of the pulse shaper 170A. The RZ DAC 140B outputs an analog Q signal 155B from the output 144B of the RZ DAC 140B, which is coupled to the input 172B of the pulse shaper 170B. The pulse shapers 170A and 170B, adder 180, DSA 188, and PA 194 operate as described herein with respect to RF sampling transmitter 100A shown in FIG. 1A.

Although FIGS. 1A and 1B illustrate distinct systems for reducing image artifacts in even and odd harmonics, a single system can reduce image artifacts in either even or odd harmonics. For example to reduce image artifacts in a harmonic of a number N times fs where N is any integer either even or odd, an RF sampling transmitter can introduce an offset $$\frac{T}{4N}$$

between the I data signal 125A and the Q data signal 125B and the clock signals DAC CLKs 150A and 150B. The RF sampling transmitter can implement either a time advance in the Q signal chain as shown in FIG. 1A or a time delay in the I signal chain shown as shown in FIG. 1B to introduce the offset $$\frac{T}{4N}$$

between the I data signal 125A and the Q data signal 125B.

Figure 2A:
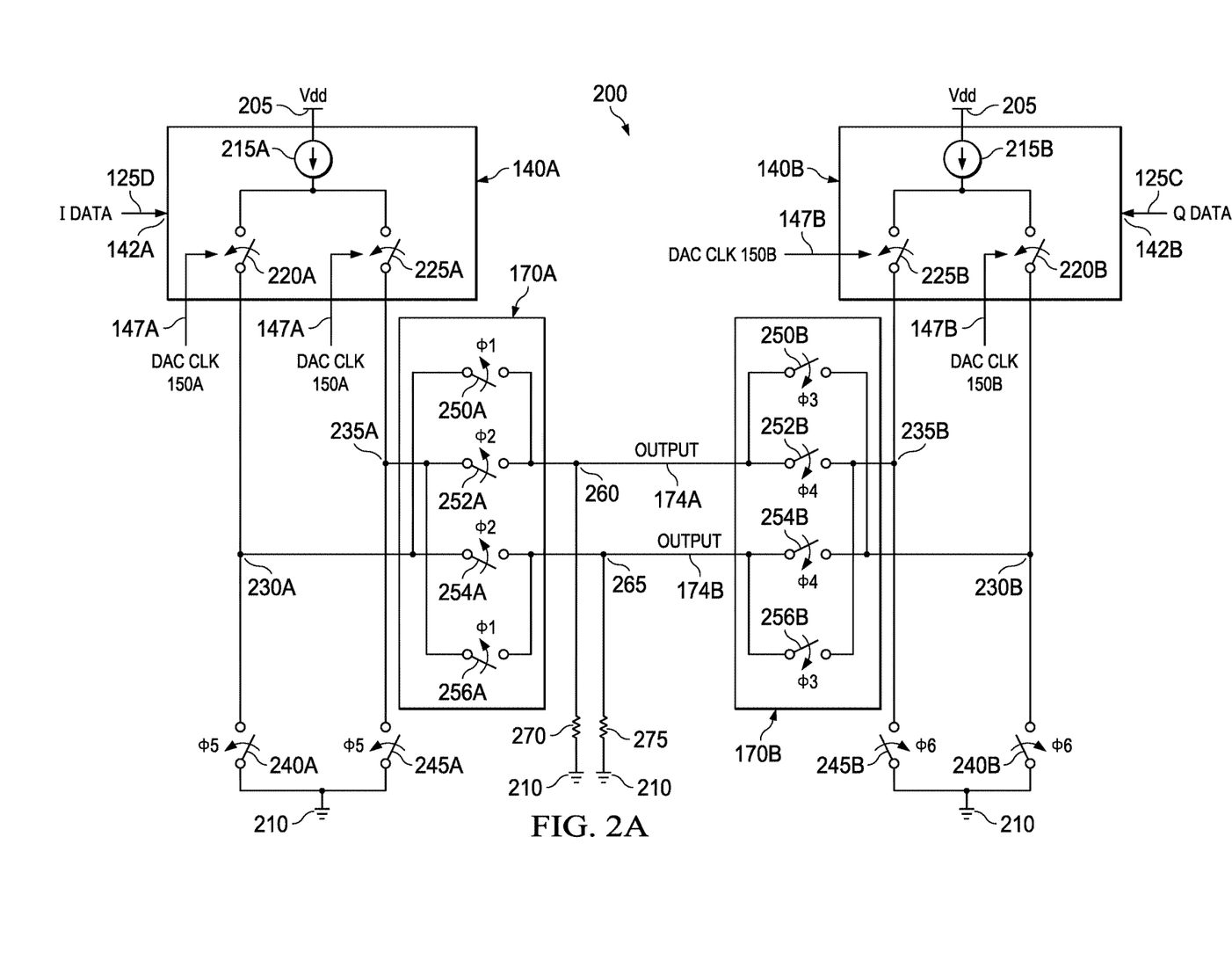
FIG. 2A is a circuit including two return-to-zero digital-to-analog converters and a time advance circuit for use in the radio frequency sampling transmitter shown in FIG. 1A.

FIG. 2A shows an example circuit diagram 200 for the RZ DACs 140A and 140B, the delay circuit 160, and pulse shapers 170A-B shown in FIG. 1A. In some example embodiments, RZ DAC 140A and RZ DAC 140B are each 14-bit DACs and each includes additional circuitry (not shown). RZ DAC 140A receives I data 125D at an input 142A and includes a current source 215A and switches 220A and 225A. Current source 215A is coupled to a supply voltage rail Vdd 205 (e.g., 3.3 Volts). Switch 220A is coupled to current source 215A and to node 230A, and switch 225A is coupled to current source 215A and to node 235A. Switch 240A is coupled to node 230A and to common potential (e.g. ground) 210. Switch 245A is coupled to node 235A and to ground 210. Switches 220A and 225A are configured to open and close based on DAC CLK signal 150A from input 147A, and switches 240A and 245A are configured to open and close based on a control signal φ5 which has a frequency that is approximately twice the sampling frequency fs.

RZ DAC 140B is similar to RZ DAC 140A and receives time-advanced Q data 125C. RZ DAC 140B includes a current source 215B and switches 220B and 225B. Current source 215B is coupled to a supply voltage rail Vdd 205. Switch 220B is coupled to current source 215B and to node 230B. Switch 225B is coupled to current source 215B and to node 235B. Switch 240B is coupled to node 230B and to ground 210. Switch 245B is coupled to node 235B and to ground 210. Switches 220B and 225B are configured to open and close based on DAC CLK signal 150B from input 147B, and switches 240B and 245B are configured to open and close based on a control signal φ6 which is approximately twice the sampling frequency fs.

Pulse shaper 170A includes a switching bank with switches 250A, 252A, 254A, and 256A. Switch 250A is coupled to node 230A and node 260. Switch 256A is coupled to node 235A and node 265. Switches 250A and 256A are configured to open and close based on control signal φ1. Switch 252A is coupled to node 235A and node 260. Switch 254A is coupled to node 230A and to node 265. Switches 252A and 254A are configured to open and close based on control signal φ2.

Pulse shaper 170B is similar to pulse shaper 170A and includes a switching bank with switches 250B, 252B, 254B, and 256B. Switch 250B is coupled to node 230B and node 260. Switch 256B is coupled to node 235B and node 265. Switches 250B and 256B are configured to open and close based on control signal φ3. Switch 252B is coupled to node 235B and node 260. Switch 254B is coupled to node 230B and to node 265. Switches 252B and 254B are configured to open and close based on control signal φ4. A resistor 270 is coupled to node 260 and to ground 210. A resistor 275 is coupled to node 265 and to ground 210. Control signals φ1-φ4 are described further herein with reference to FIG. 2B. Node 260 is coupled to the pulse shaper output 174A of pulse shaper 170A, and node 265 is coupled to the pulse shaper output 174B of pulse shaper 170B.

Figure 2B:
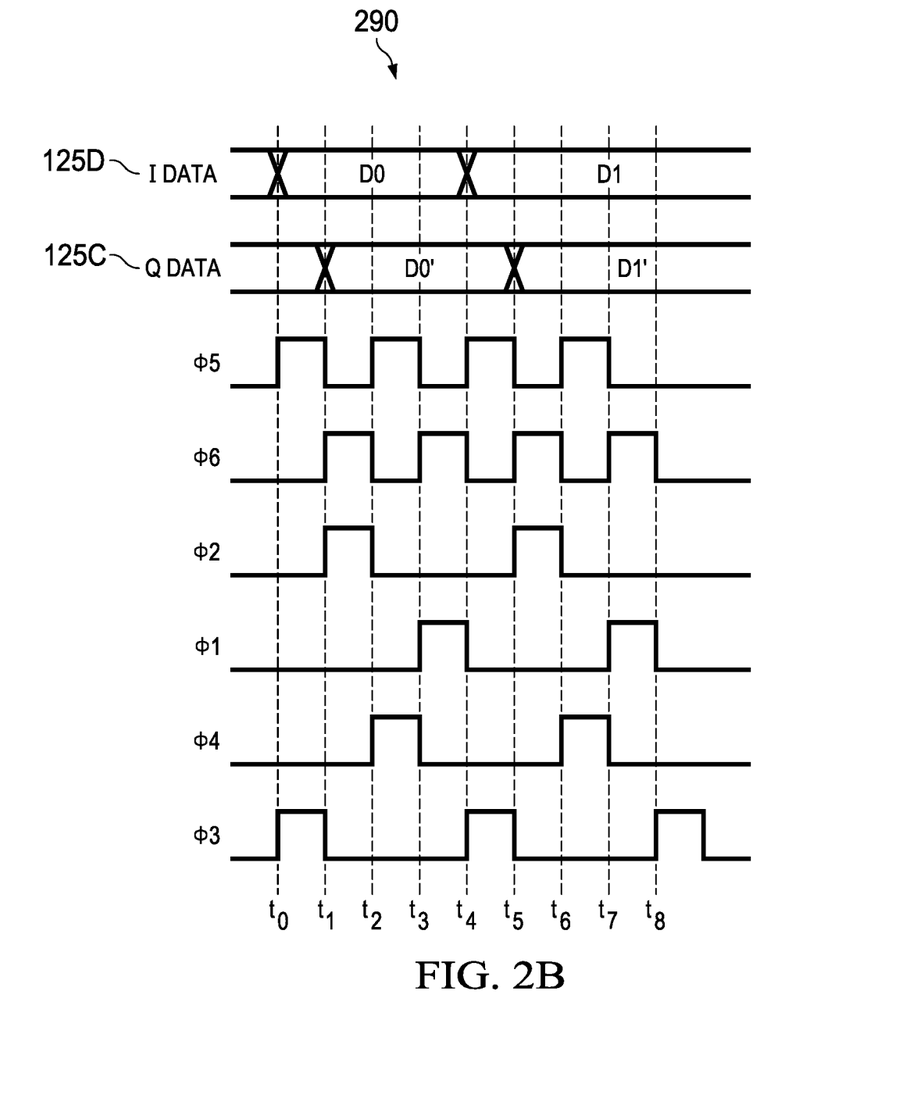
FIG. 2B shows a set of waveforms of control signals and in-phase and quadrature data signals in the digital-to-analog converters shown in FIG. 2A.

FIG. 2B shows a set of waveforms 290 of control signals φ1-6 and I data signal 125D and time-advanced Q data signal 125C, shown in FIG. 2A. Time-advanced Q data signal 125C is offset from I data signal 125D by T/4, and a T/4 time advance is introduced by advance circuit 130 in digital transmitter 105 shown in FIG. 1A to compensate. In RF sampling transmitter 100A, advance circuit 130 introduces a time advance of T/4 to reduce the magnitude of image artifacts at odd harmonics of fs, but in other implementations advance circuit 130 introduces a time advance of T/8 to reduce the magnitude of image artifacts at even harmonics of fs.

The DAC CLK signals 150A and 150B are offset by T/4. At time t0, the DAC CLK signal 150A causes switches 220A and 225A to be closed, and the control signal φ5 causes switches 240A and 245A to be closed, such that current source 215A is coupled to pulse shaper 170A and ground 210. The DAC CLK signal 150B causes switches 220B and 225B to be open, and the control signal φ6 causes switches 240B and 245B to be open, such that current source 215B is disconnected from ground 210 and pulse shaper 170B. At time t1, the DAC CLK signal 150A and the control signal φ5 cause switches 220A, 225A, 240A, and 245A to be open such that current source 215A is disconnected from pulse shaper 170A and ground 210. The DAC CLK signal 150B and the control signal φ6 causes switches 220B, 225B, 240B, and 245B to be closed such that current source 215B is coupled to ground 210 and pulse shaper 170B.

Control signals φ1 and φ2 have a frequency approximately equal to the sampling frequency fs. In this example, only one of φ1 or φ2 is high at a time. Accordingly, φ1 and φ2 alternate which is logic high while the DAC CLK signal 150A and control signal φ5 cause switches 220A, 225A, 240A and 245A to be open. For example, at t1, φ2 transitions logic high, causing switches 252A and 254A to close such that node 230A is coupled to node 265 and resistor 275 and node 235A is coupled to node 260 and resistor 270. At t3, φ1 transitions logic high, causing switches 250A and 256A to close such that node 230A is coupled to node 260 and resistor 270 and node 235A is coupled to node 265 and resistor 275.

Control signals φ3 and φ4 have a frequency approximately equal to the sampling frequency fs and also alternate which is logic high while the DAC CLK signal 150B and control signal φ6 cause switches 220B, 225B, 240B, and 245B to be open. For example, at t2, φ4 goes logic high, causing switches 252B and 254B to close such that node 230B is coupled to node 265 and resistor 275 and node 235B is coupled to node 260 and resistor 270. At t4, φ3 transitions logic high, causing switches 250B and 256B to close such that node 230B is coupled to node 260 and resistor 270 and node 235B is coupled to node 265 and resistor 275.

Alternating data samples from I data 125D and time-advanced Q data 125C are shaped by the switching banks in pulse shapers 170A-B and resistors 270 and 275. I data 125D and time-advanced Q data 125C input to DACs 140A-B have frequencies approximately equal to the desired center frequency fc minus fs, since pulse shapers 170A-B up-convert the signals by fs. As discussed previously herein with respect to FIG. 1A, the T/4 offset for DAC CLKs 150A and 150B and the time advance and delay introduced by advance circuit 130 and delay circuit 160, respectively, enables rejection of images at frequencies adjacent to fc without a fractional local oscillator or image-reject filters.

Figure 3A:
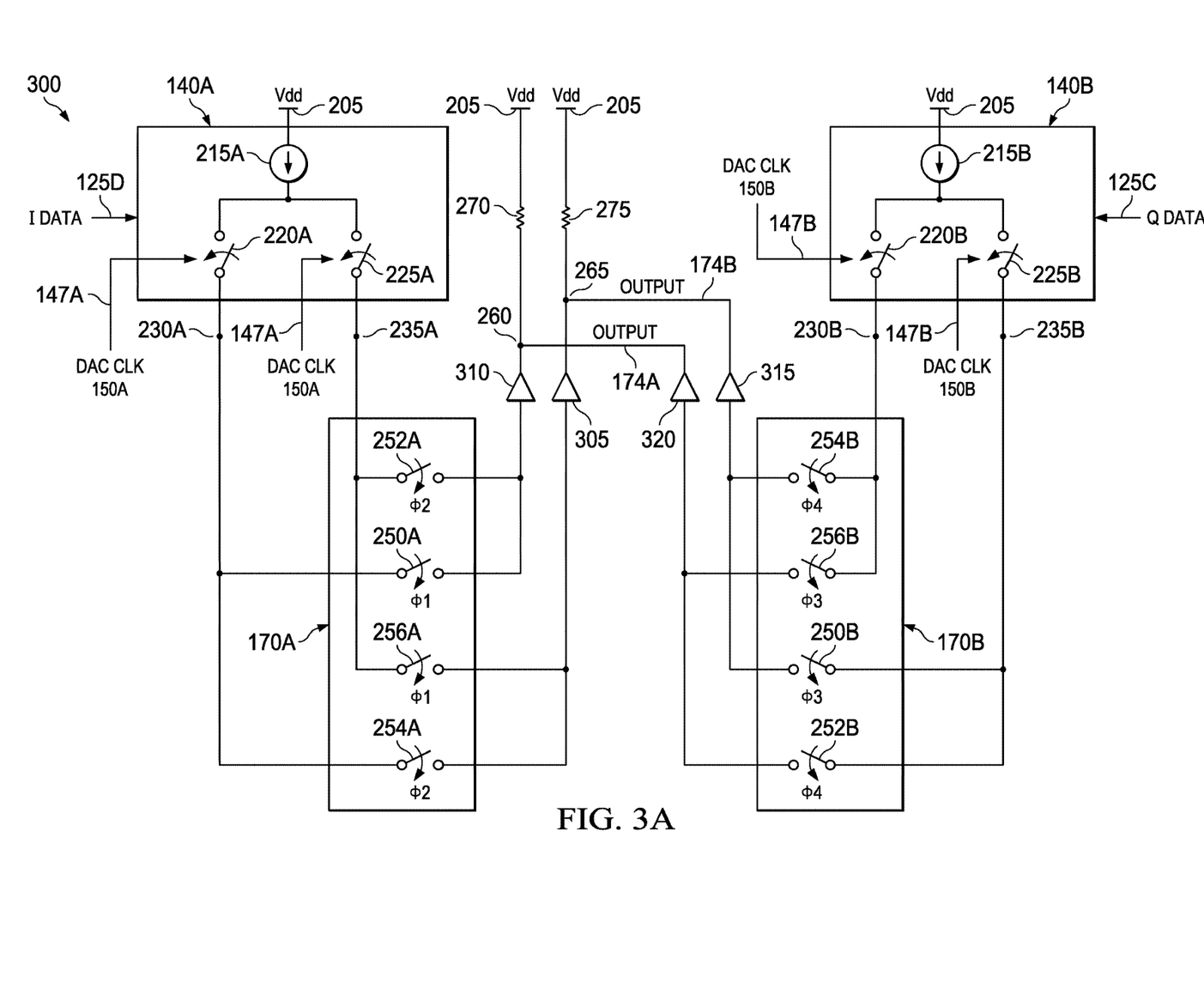
FIG. 3A is a circuit including two non-return-to-zero digital-to-analog converters and a time advance circuit for use in the radio frequency sampling transmitter shown in FIG. 1A.

FIG. 3A shows an example circuit diagram 300 for the delay circuit 160 and pulse shapers 170A and 170B shown in FIG. 1A, as well as non-return to zero (NRZ) DACs used in place of the RZ DACs 140A and 140B to illustrate that both RZ and NRZ DACs can be used in the systems 100A and 100B. The circuit diagram 300 is similar to the circuit diagram 200 shown in FIG. 2A, but includes current buffers 305, 310, 315, and 320 and omits switches 240A-240B and 245A-245B. The switches 240A-240B and 245A-245B in RZ DACs 140A and 140B, described herein with reference to FIG. 2A, couple the DACs 140A and 140B to ground based on the control signals φ5 and φ6, causing the DAC output signals 155A and 155B to return to zero between data samples. Current buffer 305 is coupled between switches 254A and 256A and node 265. Current buffer 310 is coupled between switches 250A and 252A and node 260. A resistor 270 is coupled to node 260 and to supply voltage rail Vdd 205. Current buffer 315 is coupled between switches 250B and 254B and node 265. Current buffer 315 is coupled between switches 252B and 256B and node 260. A resistor 275 is coupled to node 265 and to supply voltage rail Vdd 205. Control signals φ1-φ4 are described further herein with reference to FIG. 3B.

Figure 3B:
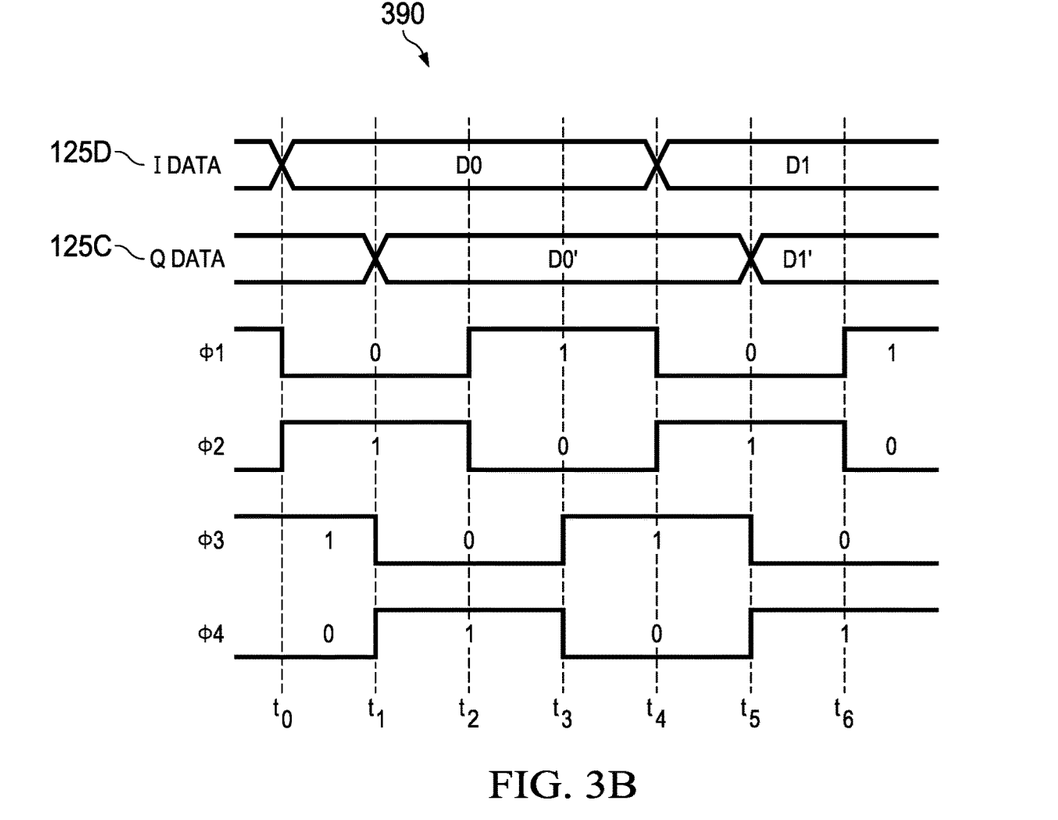
FIG. 3B shows a set of waveforms of control signals and in-phase and quadrature data signals in the digital-to-analog converters shown in FIG. 3A.

FIG. 3B shows a set of waveforms 390 of control signals φ1-φ4 and I data signal 125D and time-advanced Q data signal 125C, described in FIG. 3A. Time-advanced Q signal 125C is offset from I data signal 125D by T/4, and a T/4 time advance is introduced by advance circuit 130 in digital transmitter 105 shown in FIG. 1A to compensate. In RF sampling transmitter 100A, advance circuit 130 introduces a time advance of T/4 to reduce the magnitude of image artifacts at odd harmonics of fs, but in other implementations advance circuit 130 introduces a time advance of T/8 to reduce the magnitude of image artifacts at even harmonics of fs.

Control signals φ1 and φ2 have a frequency approximately equal to the sampling frequency fs and alternate which is logic high. For example, at t0 φ2 goes logic high, causing switch 254A to close such that node 230A is coupled to current buffer 305 and resistor 275, and causing switch 252A to close such that node 235A is coupled to buffer 310 and resistor 270. At t2, φ1 transitions logic high, causing switch 250A to close such that node 230A is coupled to current buffer 310 and resistor 270, and causing switch 256A to close such that node 235A is coupled to current buffer 305 and resistor 275.

Control signals φ3 and φ4 have a frequency approximately equal to the frequency of I signal 120A and time-advanced Q signal 120C and alternate which is logic high. For example, at t1, φ4 transitions logic high, causing switch 252B to close such that node 235B is coupled to current buffer 320 and resistor 270, and causing switch 254B to close such that node 230B is coupled to current buffer 315 and resistor 275. At t3, φ3 transitions logic high, causing switch 250B to close such that node 235B is coupled to current buffer 315 and resistor 275, and causing switch 256B to close such that node 230B is coupled to current buffer 320 and resistor 270.

Figure 4:
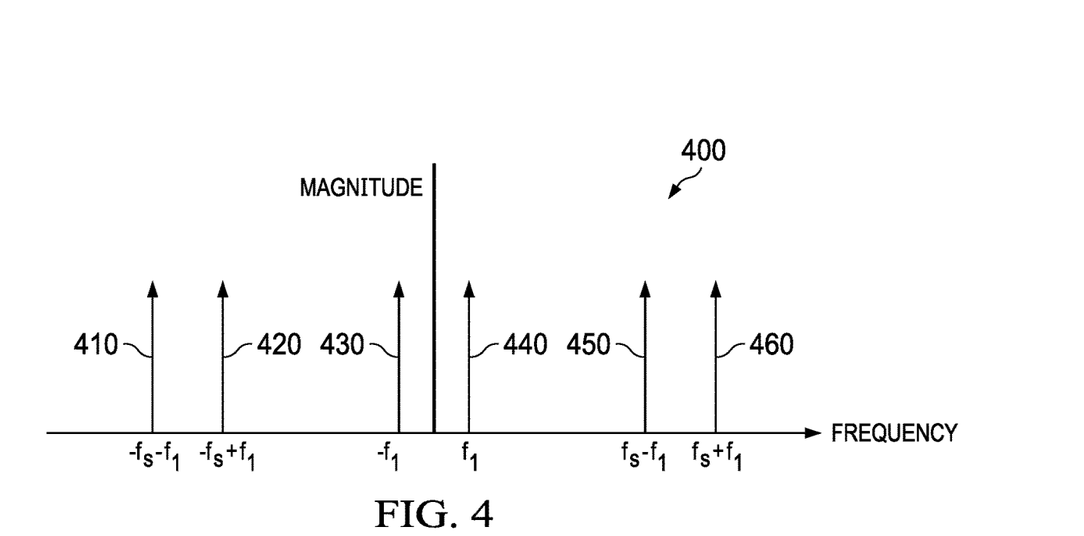
FIG. 4 shows a frequency spectrum of an example input signal for a digital-to-analog converter included in the radio frequency sampling transmitter shown in FIGS. 1A and 1B.

FIG. 4 shows a frequency spectrum 400 of an example input signal to a DAC 140A or 140B in RF sampling transmitter 100A shown in FIG. 1A or RF sampling transmitter 100B shown in 1B. FIG. 4 is not drawn to scale, so the relative magnitudes may be the same or different than shown in FIG. 4. The example input signal can be the I data signal 125D input to DAC 140A in RF sampling transmitter 100A, the delayed Q data signal 125C input to DAC 140B in RF sampling transmitter 100A, the delayed I data signal 125D input to DAC 140A in RF sampling transmitter 100B, or the Q data signal 125C input to DAC 140B in RF sampling transmitter 100B.

The example input signal is an impulse train with a frequency component 410 at −fs−f1, a frequency component 420 at −fs+f1, a frequency component 430 at −f1, a frequency component 440 at f1, a frequency component 450 at fs−f1, and a frequency component 460 at fs+f1, where the RF signal 107 to be transmitted is within the frequency band of plus or minus the frequency f1. For example, the signal 107 may be at the frequency f1 and an image is at the frequency of negative f1. Conversely, the signal 107 may be at the frequency of negative f1 and an image is at the frequency f1. The DAC 140A or 140B converts the digital impulses 410, 420, 430, 440, 450, and 460 to an analog signal. The pulse shape imposed by the pulse shaper 170A or 170B, respectively, boosts the frequency component 430 at −f1 and attenuates the remaining frequency components at 410, 420, 440, 450, and 460 or boosts the frequency component 440 at f1 and attenuates the remaining frequency components at 410, 420, 430, 450, and 460.

Figure 5:
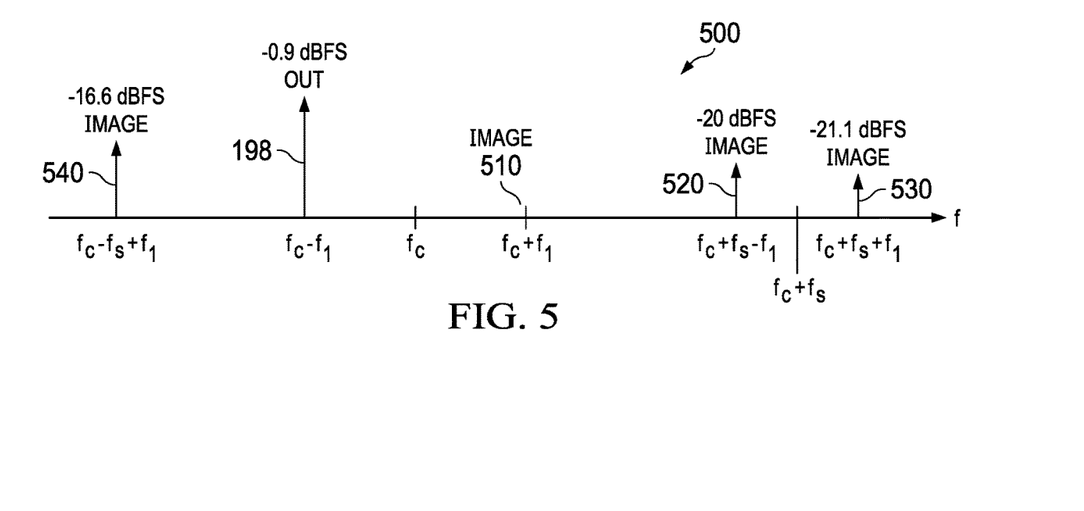
FIG. 5 shows a frequency spectrum of an example transmitted signal output by the radio frequency sampling transmitter shown in FIGS. 1A and 1B.

FIG. 5 shows a frequency spectrum 500 of the transmitted signal OUT 198 from RF sampling transmitter 100A shown in FIG. 1A or from RF sampling transmitter 100B shown in FIG. 1B. FIG. 5 is not drawn to scale, so the relative magnitude of the signals is much more pronounced than depicted in FIG. 5. The frequency of OUT 198 is at fc−f1, where the RF sampling transmitter 100 transmits OUT 198 in the frequency band of plus or minus a frequency f1 around the center frequency fc. That is, the frequency bandwidth of OUT 198 is between fc−f1 and fc+f1. For example, fc is three gigaHertz (GHz), fs is 3 GHz, and f1 is 0.4 GHz. OUT 198 has a magnitude of −0.9 decibels relative to full scale (dBFS). The image 510 at fc+f1, 3.4 GHz, is greatly reduced by the T/4 time advance and delay. The image 520 is at fc+fs−f1, 5.6 GHz, and the image 530 is at fc+fs+f1, 6.4 GHz. The image 540 is at fc−fs+f1, 0.4 GHz. Images 520, 530, and 540 have very small magnitudes relative to OUT 198. The relatively low magnitudes and distant frequencies from OUT 198 relax the bandpass filtering requirements to capture OUT 198 and omit the images 520, 530, and 540.

Figure 6:
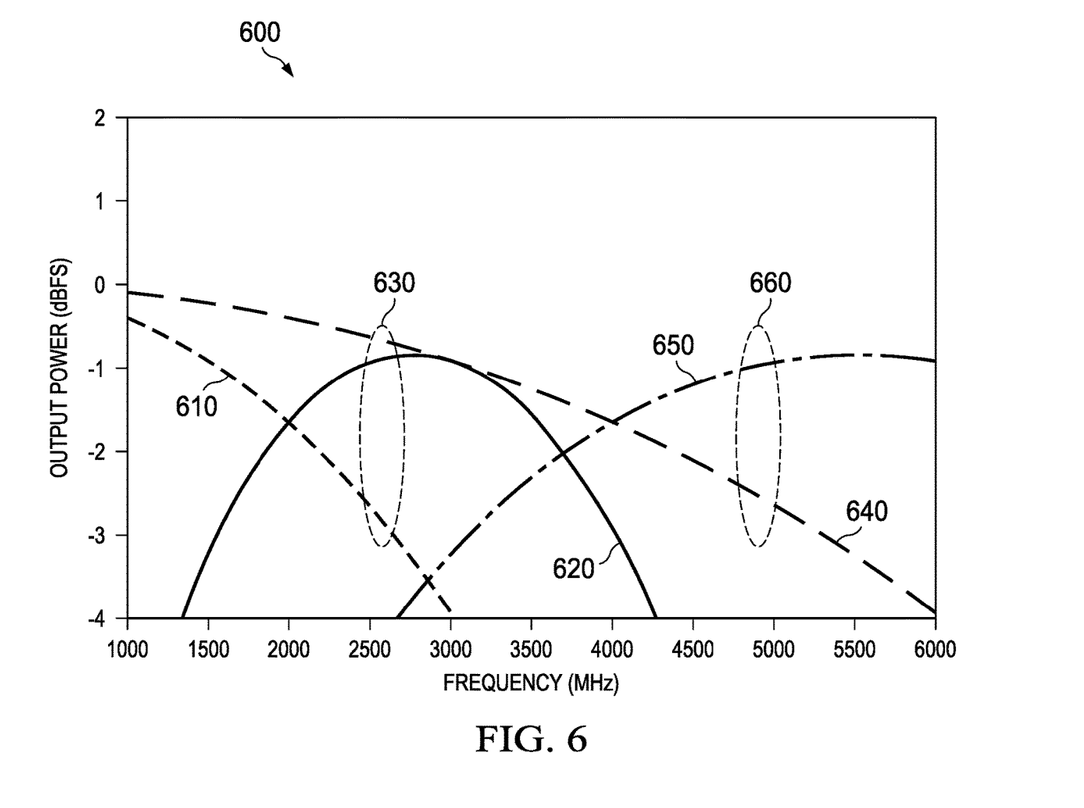
FIG. 6 shows a graph of signal power for the output signal from a conventional radio frequency sampling transmitter and the output signal from the radio frequency sampling transmitter shown in FIGS. 1A and 1B.

FIG. 6 shows a graph 600 of signal power for the output signal from a conventional RF sampling transmitter and the output signal OUT 198 from the RF sampling transmitter shown in FIGS. 1A and 1B. At the 2.6 GHz band indicated by callout 630, the output signal 610 from a conventional RF sampling transmitter with a 6 GSPS fs is approximately −2.9 dBFS, while the output signal 620 from the RF sampling transmitter 100 with a 3 GSPS fs is approximately −0.9 dBFS. At the 4.9 GHz band indicated by callout 660, the output signal 640 from a conventional RF sampling transmitter with a 12 GSPS fs is approximately −2.5 dBFS, while the output signal 650 from the RF sampling transmitter 100 with a 6 GSPS fs is approximately −1.0 dBFS. The callouts 630 and 660 illustrate the improved TX output power of RF sampling transmitter 100 relative to the conventional RF sampling transmitter while operating at half the sampling frequency.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

Modifications are possible in the described embodiments, and other embodiments are possible, within the scope of the claims.

What is claimed is:

1. A radio frequency (RF) transmitter, comprising:
an upconverter configured to output an in-phase (I) signal and a quadrature (Q) signal;
a digital timing offset circuit coupled to the upconverter and configured to introduce a time offset between the I signal and the Q signal;
a first digital-to-analog converter (DAC) coupled to at least one of the upconverter and the digital timing offset circuit and configured to (i) receive a first clock signal and the I signal and (ii) output an analog I signal;
a second DAC coupled to at least one of the upconverter and the digital timing offset circuit and configured to (i) receive a second clock signal and the Q signal and (ii) output an analog Q signal, the first and second clock signals having a same frequency and being offset relative to each other by the time offset;
an analog timing offset removal circuit coupled to at least one of the first DAC and the second DAC and configured to remove the time offset between the analog I signal and the analog Q signal;
a first pulse shaper coupled to at least one of the first DAC and the analog timing offset removal circuit and configured to receive the analog I signal and output a pulse-shaped I signal;
a second pulse shaper coupled to at least one of the second DAC and the analog timing offset removal circuit and configured to receive the analog Q signal and output a pulse-shaped Q signal; and
an adder coupled to the first pulse shaper and the second pulse shaper and configured to receive the pulse-shaped I and Q signals and output an intermediate frequency signal.

2. The RF transmitter of claim 1, wherein the digital timing offset circuit comprises a delay circuit configured to (i) receive the I signal and (ii) introduce a delay of the time offset into the I signal, and wherein the analog timing offset removal circuit comprises an advance circuit configured to (i) receive the analog I signal and (ii) advance the analog I signal by the time offset.

3. The RF transmitter of claim 1, wherein the digital timing offset circuit comprises an advance circuit configured to (i) receive the Q signal and (ii) introduce an advance of the time offset into the Q signal, and wherein the analog timing offset removal comprises a delay circuit configured to (i) receive the analog Q signal and (ii) delay the analog Q signal by the time offset.

4. The RF transmitter of claim 3, further comprising a delay circuit configured to receive the I signal and delay the I signal by a first length of time equal to a number N times a period T of the I signal, wherein the advance circuit is configured to introduce the advance of the time offset into the Q signal by being configured to delay the Q signal by a second length of time equal to (N−1)T plus T minus the time offset, wherein N is an integer equal to or greater than one.

5. The RF transmitter of claim 1, further comprising:
a digital step attenuator configured to receive the intermediate frequency signal and output an attenuated signal; and
a power amplifier configured to receive the attenuated signal and output a transmitter signal.

6. The RF transmitter of claim 1, wherein the time offset is equal to one fourth a period T.

7. The RF transmitter of claim 1, wherein the time offset is equal to one eighth a period T.

8. The RF transmitter of claim 1, wherein the time offset is equal to a period T divided by four times a number N, wherein N is an integer equal to or greater than one.

9. A circuit, comprising:
a first digital-to-analog converter (DAC) configured to receive an in-phase signal and having:
a first output;
a second output;
a first current source;
a first switch coupled to the first current source and to the first output; and
a second switch coupled to the first current source and to the second output, the first and second switches being configured to receive a first clock signal;
a third switch coupled to the first output and to a common mode voltage rail;
a fourth switch coupled to the second output and to the common mode voltage rail, the third and fourth switches being configured to receive a first control signal;
a first switching bank having a first input, a second input, a third output, and a fourth output, the first input being coupled to the first output and the second input being coupled to the second output;
a first resistor coupled to the third output and to the common mode voltage rail;
a second resistor coupled to the fourth output and to the common mode voltage rail;
a second DAC configured to receive a time-advanced quadrature signal and having:
a fifth output;
a sixth output;
a second current source;
a fifth switch coupled to the second current source and to the fifth output; and
a sixth switch coupled to the second current source and to the sixth output, the fifth and sixth switches being configured to receive a second clock signal;
a seventh switch coupled to the fifth output and to ground;
an eighth switch coupled to the sixth output and to ground, the seventh and eighth switches being configured to receive a second control signal; and
a second switching bank having a third input, a fourth input, a seventh output, and an eighth output, the third input being coupled to the fifth output and the fourth input being coupled to the sixth output.

10. The circuit of claim 9, wherein the first switching bank comprises:
a ninth switch coupled between the first input and the fourth output;
a tenth switch coupled between the second input and the fourth output;
an eleventh switch coupled between the first input and the third output; and
a twelfth switch coupled between the second input and the third output, the ninth and twelfth switches being configured to receive a third control signal and the tenth and eleventh switches being configured to receive a fourth control signal.

11. The circuit of claim 10, wherein the third and fourth control signals alternate which is logic high while the first control signal is logic low.

12. The circuit of claim 9, wherein the second switching bank comprises:
a thirteenth switch coupled between the third input and the eighth output;
a fourteenth switch coupled between the fourth input and the eighth output;
a fifteenth switch coupled between the third input and the seventh output; and
a sixteenth switch coupled between the fourth input and the seventh output, the thirteenth and sixteenth switches being configured to receive a fifth control signal and the fourteenth and fifteenth switches being configured to receive a sixth control signal.

13. The circuit of claim 12, wherein the fifth and sixth control signals alternate which is logic high while the second control signal is logic low.

14. The circuit of claim 9, wherein the first clock signal and the second clock signal have a same frequency, and wherein the second clock signal is offset from the first clock signal by one fourth a period T.

15. The circuit of claim 9, wherein the first and second control signals are inverted relative to each other.

16. An apparatus, comprising:
a digital time offset circuit configured to introduce a time offset between an in-phase (I) signal and a quadrature (Q) signal;
a first digital-to-analog converter (DAC) configured to receive the I signal;
a first pulse shaper coupled to an output of the first DAC;
a second DAC configured to receive the Q signal, wherein the first and second DACs have a same clock frequency that is offset relative to each other by the time offset;
an analog time offset removal circuit configured to remove the time offset between the I signal and the Q signal;
a second pulse shaper coupled to an output of the second DAC; and
an adder coupled to an output of the first pulse shaper and an output of the second pulse shaper, wherein the adder is configured to output an intermediate frequency signal.

17. The apparatus of claim 16, further comprising a digital transmitter, wherein the digital transmitter comprises:
a digital upconverter having a first output and a second output; and
the digital time offset circuit coupled to the second output, wherein the digital upconverter is configured to receive an input signal, and wherein the first output is for the I signal and the second output is for the Q signal.

18. The apparatus of claim 16, further comprising:
a digital step attenuator coupled to an output of the adder; and
a power amplifier coupled to an output of the digital step attenuator and configured to output a transmitter signal.

19. The apparatus of claim 16, wherein the time offset is one-fourth a period T, such that image artifacts at odd harmonics of a sampling frequency of the first and second DACs are reduced.

20. The apparatus of claim 16, wherein the time offset is one-eighth a period T, such that image artifacts at even harmonics of a sampling frequency of the first and second DACs are reduced.

21. The apparatus of claim 16, wherein the digital time offset circuit comprises an advance circuit configured to (i) receive the Q signal and (ii) introduce an advance of the time offset into the Q signal, and wherein the analog time offset removal circuit comprises a delay circuit coupled to the output of the second DAC and configured to introduce a delay of the time offset.

22. The apparatus of claim 21, further comprising a digital delay circuit configured to (i) receive the I signal and (ii) introduce a first delay equal to a number N times a period T, wherein the advance circuit is configured to introduce the advance of the time offset into the Q signal by being configured to introduce a second delay equal to (N−1)T plus T minus the time offset, wherein N is an integer equal to or greater than one.

23. The apparatus of claim 16, wherein the digital time offset circuit comprises a delay circuit configured to (i) receive the I signal and (ii) introduce a delay of the time offset, and wherein the analog time offset removal circuit comprises an advance circuit coupled to the output of the first DAC and configured to introduce an advance of the time offset.

24. The apparatus of claim 16, wherein:
the first DAC comprises a first current source, a first switch coupled to the first current source and to a first output, and a second switch coupled to the first current source and to a second output, the first and second switches being configured to receive a first clock signal;
the second DAC comprises a second current source, a third switch coupled to the second current source and to a third output, and a fourth switch coupled to the second current source and to a fourth output, the third and fourth switches being configured to receive a second clock signal;
the apparatus further comprises:
a fifth switch coupled to the first output and to ground and a sixth switch coupled to the second output and to ground, the fifth and sixth switches being configured to receive a first control signal; and
a seventh switch coupled to the third output and to ground and an eighth switch coupled to the fourth output and to ground, the seventh and eighth switches being configured to receive a second control signal, wherein the first and second control signals are inverted relative to each other;
the first pulse shaper comprises a first switching bank coupled to the first and second outputs;
the second pulse shaper comprises a second switching bank coupled to the third and fourth outputs and to the first switching bank; and
the apparatus further comprises:
a first resistor coupled to the first and second switching banks and to ground; and
a second resistor coupled to the first and second switching banks and to ground.

* * * * *